United States Patent
Lesso et al.

(10) Patent No.: US 10,263,633 B2
(45) Date of Patent: Apr. 16, 2019

(54) MODULATORS (71) Applicant: Cirrus Logic International Semiconductor Ltd., Edinburgh (GB)

(72) Inventors: John Paul Lesso, Edinburgh (GB); David Paul Singleton, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/991,619

(22) Filed: May 29, 2018

(65) Prior Publication Data
US 2018/0351569 A1    Dec. 6, 2018

Related U.S. Application Data (60) Provisional application No. 62/512,811, filed on May 31, 2017.

(30) Foreign Application Priority Data

Jul. 11, 2017 (GB) .................... 1711164.2

(51) Int. Cl.
*H03M 1/06* (2006.01)
*H03M 1/08* (2006.01)
(Continued)

(52) U.S. Cl.
CPC ......... *H03M 1/504* (2013.01); *H03M 1/0604* (2013.01); *H03M 1/0626* (2013.01); *H03M 1/0854* (2013.01); *H03M 1/34* (2013.01)

(58) Field of Classification Search
CPC .. H03M 1/504; H03M 1/0604; H03M 1/0626; H03M 1/0854; H03M 1/34
(Continued)

(56) References Cited

U.S. PATENT DOCUMENTS 7,573,956 B2 * 8/2009 Lazar .................... H03M 1/125
341/110
7,750,835 B1  7/2010 Cruz-Albrecht et al.
(Continued)

FOREIGN PATENT DOCUMENTS

DE    2420519 A1    11/1975
DE    10233391 C1   12/2003
(Continued)

OTHER PUBLICATIONS

Combined Search and Examination Report under Sections 17 and 18(3), UKIPO, Application No. GB1711164.2, dated Jan. 8, 2018.
(Continued)

*Primary Examiner* — Khai M Nguyen
(74) *Attorney, Agent, or Firm* — Jackson Walker L.L.P.

(57) ABSTRACT

This application relates time-encoding modulators such as may be used as part of analogue-to-digital conversion. A time-encoding modulator (100) receives an analogue input signal ($S_{IN}$) at an input node (102) and outputs a corresponding time-encoded signal ($S_{OUT}$) at an output node (103). A hysteretic comparator (101) has a first comparator input connected to the input node and a comparator output connected to the output node. A feedback path extends between the output node and a second comparator input of the hysteretic comparator; with a filter arrangement (104) arranged to apply filtering to the feedback path. The hysteretic comparator (101) compares the input signal ($S_{IN}$) to the feedback signal ($S_{FB}$) with hysteresis. This provides a pulse-width modulated output signal ($S_{OUT}$) where the duty cycle encodes the input signal ($S_{IN}$).

20 Claims, 6 Drawing Sheets

(51) Int. Cl.
  *H03M 1/34*   (2006.01)
  *H03M 1/50*   (2006.01)
(58) Field of Classification Search
  USPC .................................................. 341/166, 143
  See application file for complete search history.

(56) References Cited

U.S. PATENT DOCUMENTS

| | | |
|---|---|---|
| 9,705,519 B1 * | 7/2017 | Baringer ............ H03M 7/3073 |
| 2012/0098686 A1 | 4/2012 | Wang |
| 2016/0359500 A1 | 12/2016 | Lesso et al. |

FOREIGN PATENT DOCUMENTS

| | | |
|---|---|---|
| JP | 2014127764 A | 7/2014 |
| WO | 2004105251 A1 | 12/2004 |

OTHER PUBLICATIONS

International Search Report and Written Opinion of the International Searching Authority, International Application No. PCT/GB2018/051461, dated Oct. 24, 2018.

Lazar, A.A. et al., "Perfect Recover and Sensitivity Anaysis of Time Encoded Bandlimited Signals", IEEE Transactions on Circuits and Systems Part I: Regular Papers, IEEE Service Center, NY, NY, US, Oct. 1, 2004, pp. 2060-2073.

* cited by examiner

MODULATORS

FIELD OF DISCLOSURE

This application relates to methods and apparatus for modulation and demodulation of signals, and in particular to time-encoding modulators and to methods and apparatus using time-encoding modulators.

BACKGROUND

Signal modulators are utilized in a number of applications, for instance as part of the conversion from analogue signals to digital signals or vice versa.

Conventionally analogue-to-digital converters (ADCs) and digital-to-analogue converters (DACs) are implemented using multiple analogue components such as banks of well-matched or ratioed resistors, capacitors or current sources. However there is an ongoing trend to smaller semiconductor process node geometries and such circuitry does not scale efficiently in terms of semiconductor area and/or power requirements.

Time encoding modulators are modulators that encode input data into a time-encoded data stream. For example sigma-delta ($\Sigma\Delta$) modulators (SDM's) are a type of time encoding modulator. SDMs may be used to convert an input analogue signal into a pulse-density-modulated (PDM) signal comprising a series of digital ones and zeros at a fixed sample rate and the relative density of ones and zeros corresponds to the analogue signal's amplitude. However the fixed frequency inevitably introduces quantisation noise into the signal, and SDMs usually comprise also at least one full operational amplifier. Time encoding modulators may also encode an input signal into a pulse-width modulated signal, by comparing the input signal with a periodic reference signal, such as a triangular waveform to encode the input signal by the duration of pulses in the output signal. However this requires circuitry to generate an appropriately accurate periodic reference signal and/or operational amplifier circuitry.

In general therefore there is thus a desire for smaller and/or lower power modulators that can be used, for example, as part of a signal converter such as an ADC or DAC.

SUMMARY

Embodiments of the present disclosure relate to improved time encoding modulators.

According to one aspect there is provided a time-encoding modulator comprising:
 an input node for receiving an analogue input signal;
 an output node for outputting a time-encoded signal;
 a hysteretic comparator comprising a first comparator input connected to the input node and a comparator output connected to the output node;
 a feedback path between the output node and a second comparator input of the hysteretic comparator; and
 a filter arrangement for applying filtering to the feedback path.

In some embodiments there may be a modulator controller for controlling the modulator so as to control a cycle period of the time-encoded signal. The modulator controller may be configured to control the modulator based on the time-encoded signal. The modulator may include a time-to-digital-converter configured to receive the time-encoded signal and output a digital control signal based on a parameter of the time-encoded signal. The modulator controller may be configured to receive the digital control signal. The parameter of the time-encoded signal may comprise a duration of a cycle period of the time-encoded signal, or a duty-cycle of the time-encoded signal, or a duration of a pulse of the time encoded signal. The time-to-digital converter may be configured to receive a reference clock signal and may comprise a counter configured to produce at least one count value of the number of clock cycles of the reference clock signal in a period defined by the parameter of the time-encoded signal. In some embodiments the modulator controller may comprise a hysteresis controller for controlling hysteresis of the hysteretic comparator.

The filter arrangement may comprise a resistive-capacitive filter. In some implementations the filter arrangement may comprise a first order filter or may comprise a second or higher order filter.

In some embodiments the hysteretic comparator may be configured to generate at the comparator output either a first voltage state or a second voltage state. The hysteretic comparator transitions between the first and second voltage states based on a hysteretic comparison of signal levels at the first and comparator inputs.

In some embodiments the filter arrangement may comprise a first current generator configured to receive the time-encoded signal and to generate a first controlled current signal having a first defined current during periods of the first voltage state and a second defined current during periods of the second voltage state. A capacitor may be coupled to the feedback node and configured to be charged and discharged by the first controlled current signal. In such an arrangement the modulator controller, if present, may be configured to control the first current generator so as to control the magnitude of the first defined current and the second defined current. In some embodiments there may be a second current generator configured to generate a second controlled current signal based on the time-encoded signal, wherein the apparatus is configured to output the second controlled current signal as a modulator output signal. The second current generator may be present in some embodiments where the filter arrangement does not include a first current generator.

In some embodiments the filter arrangement may configured to apply a controlled gain to the feedback signal. Additionally or alternatively a level shifter may be coupled to the input node for applying a defined level shift to the input signal. The level shifter may comprise a potential divider.

In some embodiments there may be a coupling capacitor in a signal path for the analogue input signal upstream of the first comparator input.

The time encoding modulator may be implemented as, at least part of, an integrated circuit.

The time encoding modulator may form part of an analogue-to-digital converter (ADC). An ADC may thus comprise a time encoding modulator as described above and a time-decoding-converter (TDC) configured to convert the time-encoded signal to a corresponding ADC output digital signal. The TDC may be configured to determine the duration of pulses in the time-encoded output signal as a proportion of the cycle period. In some embodiments the TDC (of the ADC) may comprise a voltage controlled oscillator (VCO) configured to receive the time-encoded signal and a counter configured to receive the output of the VCO and count a number of oscillations in each of a plurality of frames defined by a frame clock signal.

Such an ADC may be implemented as part of a signal processing circuit. In one example a signal processing circuit may comprise a main signal path for receiving a first analogue signal and outputting a first digital signal with a first analogue-to-digital converter (ADC) in the main signal path. There may also be a variable analogue gain element for applying a controlled analogue gain to the main signal path upstream of the first ADC and a gain controller for controlling the variable analogue gain element. A second ADC may be configured to receive a version of the first analogue signal from the main signal path wherein the second ADC is an ADC as described above, i.e. including a time encoding modulator according to an embodiment. The gain controller may be configured to control the variable analogue gain element based on the digital signal generated by the time encoding modulator.

In some embodiments the gain controller may be operable in an automatic gain control mode to determine an analogue gain that provides an optimised signal-to-noise ratio.

In some implementations there may be a variable digital gain element for applying a controlled digital gain to the main signal path downstream of the first ADC. In such a case the gain controller may additionally or alternatively be operable in a dynamic range extension mode, in which the gain controller is configured to control the variable analogue gain element and the variable digital gain element at least partly inversely based on the digital signal generated by said time encoding modulator.

Embodiments also relate to an electronic device having a time encoding modulator according to any of the variants described above, or an ADC or a signal processing circuit as described which include such a time encoding modulator. The electronic device may be at least one of: a battery powered device; a portable device; a communications device; a mobile telephone; a smartphone; a computing device; a laptop; notebook or tablet computer; a gaming device; a personal media player; a wearable device; a voice controlled device.

Another aspect provides a method of time encoding an analogue input signal comprising:
  receiving the analogue input signal at a first comparator input of a hysteretic comparator;
  providing a feedback signal to a second comparator input of the hysteretic comparator; and
  outputting an output of the hysteretic comparator as a time encoded signal;
  wherein the feedback signal is a version of the output time encoded signal with filtering applied. The method may further comprise controlling the modulator based on the time-encoded signal so as to control a cycle period of the time-encoded signal. The method may operate in any of the variants described herein.

In a further aspects there is provided a time encoding modulator comprising:
  a hysteretic comparator comprising: a first comparator input coupled to an input node to receive an input signal with a signal component that may vary over time; and a second comparator input coupled to a feedback node to receive a feedback signal;
  the hysteretic comparator being configured to compare, with hysteresis, the input signal to the feedback signal and to transition between first and second output states based on said comparison so as to generate a time-encoded output signal at a comparator output; and
  a filter arrangement configured to filter the time-encoded signal to provide the feedback signal to the feedback node.

In a further aspect there is provided a time encoding modulator comprising:
  a comparator comprising a first input for receiving an input signal; and a second input for receiving a feedback signal, wherein the comparator is configured to compare, with hysteresis, the input signal to the feedback signal so as to generate a time-encoded output signal at a comparator output; and
  a filter arrangement configured to filter the time-encoded signal so as to provide the feedback signal to the second input.

In some embodiments of these further aspects there may be a modulator controller for controlling the modulator so as to control a cycle period of the time-encoded signal. The modulator controller may be configured to control the modulator based on the time-encoded signal.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

Embodiments relate to methods and apparatus for modulating an input analogue signal into a time encoded signal, in particular into a form of pulse width modulated (PWM) signal. In particular, embodiments relate to a time-encoding modulator receiving an analogue input signal at an input node and outputting a binary time-encoded signal at an output node. The time encoding modulator comprises a hysteretic comparator having a first comparator input connected to the input node and a comparator output connected to the output node. A feedback path extends between the output node and a second comparator input of the hysteretic comparator and a filter arrangement is arranged to apply filtering to the feedback path. Such a modulator can be seen as a form of asynchronous sigma-delta modulator.

The modulator is advantageous in that it can be implemented in a relatively small circuit implementation, especially for smaller process node geometries, and can be implemented with relatively low power consumption. The input impedance may be relatively high which can be useful in some implementations.

Figure 1:
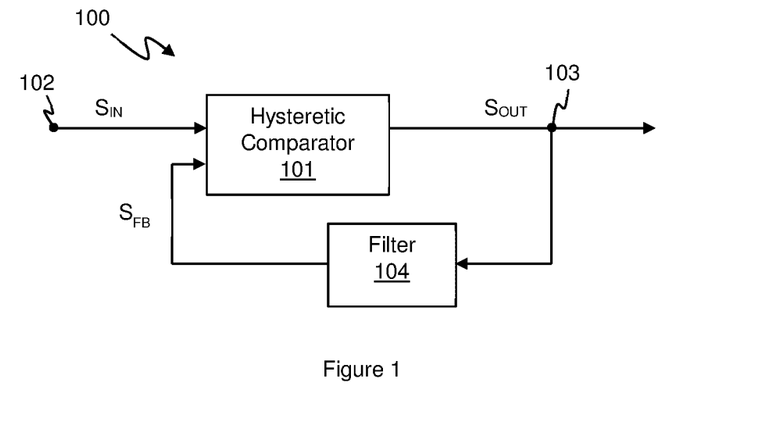
FIG. 1 illustrates one example of a time encoding modulator according to an embodiment.

FIG. 1 illustrates the general form of time encoding modulator 100 according to an embodiment. Hysteretic comparator 101 is arranged to receive an input analogue signal $S_{IN}$ from input node 102. The input node 102 may be some terminal or contact for receiving the input signal $S_{IN}$, e.g. a pad of an integrated circuit, or an output of some upstream processing block or could just be a suitable node of a signal path. The input signal $S_{IN}$ is provided to a first comparator input of the hysteretic comparator 101.

The hysteretic comparator 101 compares the input signal $S_{IN}$ at the first comparator input with a signal received at a second comparator input and generates an output signal $S_{OUT}$ based on the comparison. The hysteretic comparator 101 is operable to apply hysteresis to the comparison. The comparator output is coupled to an output node 103, which may be terminal of a circuit, e.g. a contact pad or the like, or may be any suitable node of the signal path for the output signal $S_{OUT}$. A feedback path also extends from the output node 103 to the second comparator input for providing a feedback signal $S_{FB}$ to the second comparator input. A filter arrangement 104 is arranged to apply filtering to the feedback path to provide the feedback signal $S_{FB}$.

The hysteretic comparator 101 compares the signals at the first and second comparator inputs, i.e. the input signal $S_{IN}$ and the feedback signal $S_{FB}$, and outputs either of two output states, $V_H$ and $V_L$, depending on the result of the comparison. The hysteretic comparator 101 is operable to apply hysteresis to the comparison such that a differential voltage between the signals $S_{IN}$ and $S_{FB}$ at the first and second comparator inputs must be greater (i.e. more positive or less negative) than a first threshold to transition from one output state to the other, say from output state $V_L$ to the output state $V_H$, but must be lower (i.e. less positive or more negative) than a second, different threshold to make the opposite transition, e.g. to swap from the output state $V_H$ to the output state $V_L$. The difference between these first and second thresholds corresponds to the amount of hysteresis applied. In some implementations the first and second thresholds may be equal in magnitude and opposite in polarity, i.e. the difference between the input signal $S_{IN}$ and the feedback signal $S_{FB}$ must be greater than an amount +H to transition to one state, say $V_H$, and must be lower than −H to transition to the other state. In this instance the magnitude of H can be seen as a measure of the hysteresis applied by the hysteretic comparator 101.

In some embodiments the output states $V_H$ and $V_L$ may be high and low voltage levels respectively, for instance a supply voltage $V_{DD}$ and ground, or a positive voltage and a negative voltage, possibly of equal magnitude. Thus the output signal $S_{OUT}$ may be a square wave type voltage signal produced as the hysteretic comparator 101 transitions between the two output voltage states.

In embodiments of the disclosure the input signal $S_{IN}$ of interest is a signal with some time varying signal component that encodes some information content. Thus the input signal $S_{IN}$ is not a reference voltage having a constant level or having some defined variation that does not vary from cycle-to-cycle, e.g. a triangular waveform or the like. The input signal $S_{IN}$ may, for instance, be a time varying voltage signal. In some implementations the input signal $S_{IN}$ could, for example, be an analogue input signal such as an analogue audio signal or an analogue signal derived from an audio signal.

The input signal $S_{IN}$ is thus compared to the feedback signal $S_{FB}$ which is derived from the output signal $S_{OUT}$. The feedback signal $S_{FB}$ corresponds to a filtered version of the output signal $S_{OUT}$ and the filter arrangement 104 provides some delay and signal averaging over time. Thus if the output signal $S_{OUT}$ transitions to the high state $V_H$, the feedback signal $S_{FB}$ will be lower than the output signal $S_{OUT}$ and will begin to increase, i.e. become more positive, over a period of time. If the input signal $S_{IN}$ is itself relatively constant over that period of time the difference between the input signal $S_{IN}$ and the feedback signal $S_{FB}$ will decrease, i.e. become less positive/more negative, until the relevant threshold is reached and the output signal $S_{OUT}$ transitions to the other output state $V_L$. At this point the value of the feedback signal $S_{FB}$ will start to decrease. The hysteretic comparator 101 will maintain the low state $V_L$ until the difference between the input signal $S_{IN}$ and the feedback signal $S_{FB}$ increases, i.e. becomes less negative/more positive, to the second threshold.

Thus if the input signal $S_{IN}$ maintains a relatively constant level the output of the hysteretic comparator 101 will continually cycle between the first and second output states $V_H$ and $V_L$. The time constant of the filter arrangement 104 may be chosen to be fast enough, with respect to the maximum expected rate of change of the input signal $S_{IN}$, such that the input signal $S_{IN}$ can be assumed to substantially constant over the course of a cycle. In such a case the time spent in each output state will depend on how long it takes for the feedback signal $S_{FB}$ to change by the amount defined by the hysteresis, e.g. from a value equal to $S_{IN}$−H to a value $S_{IN}$+H or vice versa. This will depend on the amount of hysteresis and the rate of change of the feedback signal $S_{FB}$. However the rate of change of the feedback signal $S_{FB}$ will depend on the then-current value of the feedback signal $S_{FB}$, in particular the difference between the level of the output state and the value of the feedback signal $S_{FB}$, which in turn depends on the level of the input signal $S_{IN}$.

For example, consider that, at a first transition, the output signal $S_{OUT}$ transitions from the low state $V_L$ to the high state $V_H$. To transition to back to the low state $V_L$ the difference between the present value of the input signal $S_{IN}$ and the feedback signal $S_{FB}$ will have to decrease to the relevant threshold, defined by the amount of hysteresis, e.g. the difference must decrease to −H. If the level of the input signal $S_{IN}$ is relatively high, the present value of the feedback signal $S_{FB}$ will also be relatively high. The difference between the level of high output state $V_H$ and the present value of the feedback signal $S_{FB}$ will thus be relatively low. Hence the value of the feedback signal $S_{FB}$ will only increase relatively slowly and it will take a relatively long time for the difference to decrease to the relevant threshold. The output signal $S_{OUT}$ will thus remain in the high state $V_H$ for a relatively long duration. However if the level of the input signal $S_{IN}$ is relatively low at the time of the first transition, then the value of the feedback signal $S_{FB}$ at that time would also be relatively low. There would thus be a greater difference between the level of the high output state $V_H$ and the value of the feedback signal $S_{FB}$. This will mean the feedback signal $S_{FB}$ would increase more rapidly, the difference between the feedback signal $S_{FB}$ and the input signal $S_{IN}$ would thus decrease more rapidly and the threshold would be reached more rapidly. Thus the output signal $S_{OUT}$ would remain in the high state $V_H$ for a shorter duration. The opposite would apply for the subsequent duration in the low state $V_L$.

The duration of a pulse corresponding to the high state $V_H$ in the output signal $S_{OUT}$ (and correspondingly the duration of a pulse corresponding to the low state $V_L$ in the output signal $S_{OUT}$) thus depends on the level of the input signal $S_{IN}$. The time encoding modulator 100 encodes the analogue input signal $S_{IN}$ as the duty cycle of the output signal $S_{OUT}$, i.e. the ratio between the duration of a pulse of a first output state, say $V_H$, to the duration of the cycle period, i.e. the total duration of the pulse of the first output state and a temporally adjacent pulse of the second output state, say $V_L$.

Figure 2:
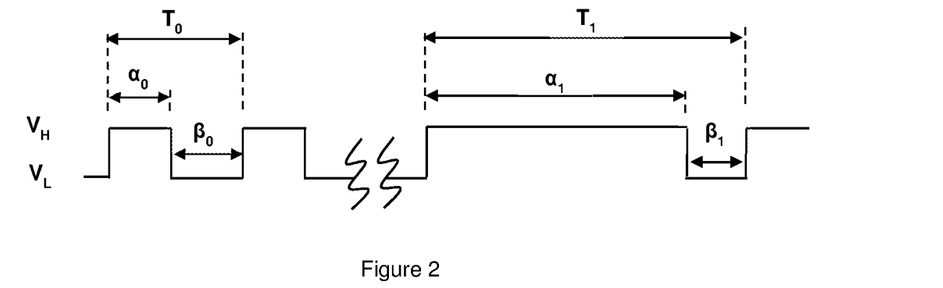
FIG. 2 illustrates the output signal from such a modulator.

FIG. 2 illustrates the principles of the output signal $S_{OUT}$ of a time encoding modulator 100 such as illustrated in FIG. 1. The output signal $S_{OUT}$ varies between the two output states $V_H$ and $V_L$. The duration of a pulse of the high state $V_H$ is denoted by $\alpha$ and the duration of a pulse of the low state $V_L$ is denoted by $\beta$. The cycle period T is equal to $\alpha+\beta$. The cycle period T can also be seen as the period between an instance of a transition from one output state to the other output state and the next instance of the same transition.

As described above the duration $\alpha$ of the pulse of the high state $V_H$ depends on the level of the input signal $S_{IN}$, as does the duration of the pulse of the low state $V_L$. For signals of zero magnitude (which corresponds to a signal reference voltage value equal to the midlevel voltage between $V_H$ and $V_L$) the periods of the pulses of each state, illustrated in FIG. 2 as $\alpha_0$ and $\beta_0$, will be equal to one another, i.e. each equal to $T_0/2$ where $T_0$ is the cycle period at zero magnitude. If the magnitude of the input signal $S_{IN}$ increases the duration of the pulse of one state will increase and the duration of the pulse of the other state will decrease to first order by:

$$\alpha = T_0/2 \cdot (1-X) \quad \beta = T_0/2 \cdot (1+X) \quad \text{(eqn. 1)}$$

where X is the level of the normalised input signal, i.e.

$$X = S_{IN}/S_{MAX} \quad \text{(eqn. 2)}$$

where $S_{MAX}$ is the maximum magnitude of the input signal defined as $(V_H-V_L)/2$. It will be appreciated that increase in duration of one pulse is not equal to the decrease in duration of the other pulse and the overall cycle period T will change:

$$T = \alpha + \beta = T_0/(1-X^2) \quad \text{(eqn. 3)}$$

Thus any increase in the magnitude of the input signal will result in an increase in the cycle period, as illustrated by the durations $\alpha_1$ and $\beta_1$ and duration $T_1$ for a cycle period at a non-zero input signal magnitude. Thus the cycle period $T_0$ (equal to $\alpha_0+\beta_0$) corresponding to an input signal of zero magnitude will be the cycle period of shortest duration. This condition is referred to as the limit cycle and the period $T_0$ is the limit cycle period. This corresponds to the fastest cycle frequency $f_0=1/T_0$ which is referred to as the limit cycle frequency.

The output signal $S_{OUT}$ thus encodes the level of the analogue input signal $S_{IN}$ as the duty cycle of one of the pulses of output state, i.e. as $\alpha/(\alpha+\beta)$.

Figure 3:
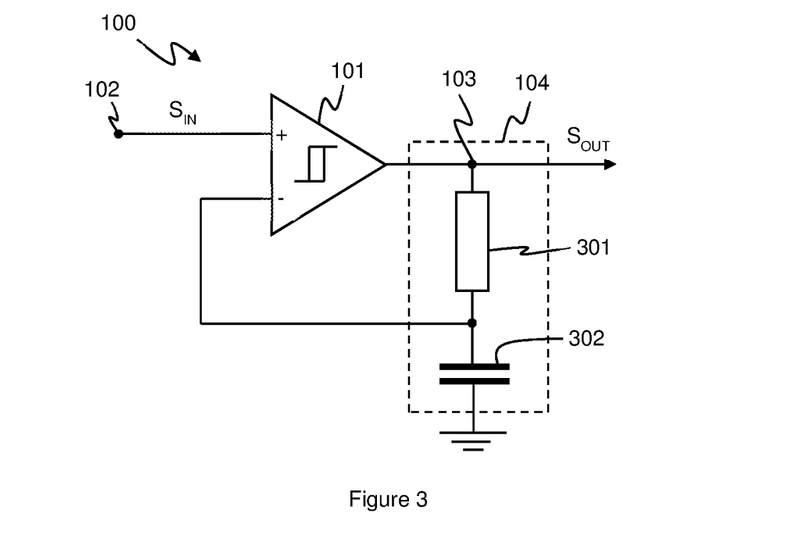
FIG. 3 illustrates in more detail one example of a modulator according to an embodiment.

FIG. 3 shows an example of an example of a modulator according to an embodiment in more detail. FIG. 3 illustrates a hysteretic comparator 101, for instance an op-amp comparator configured to provide hysteresis as will be understood by one skilled in the art. A first comparator input, which may a non-inverting input of an op-amp comparator receives the time-varying analogue input signal $S_{IN}$ from the input node 102.

In this embodiment the filter arrangement 104 comprises a resistive-capacitive (RC) filter having an impedance 301 in the feedback path and a capacitance 302 coupled between the feedback path and a reference voltage, e.g. ground. Whilst the filter arrangement 104 may be implemented using resistors and capacitors as illustrated, other RC components such as FET based resistances and/or capacitances may be used in some implementations.

As noted above the output is a square wave voltage waveform that has a limit cycle period of $T_0$ for a zero magnitude input signal. For the embodiment illustrated in FIG. 3 the limit cycle period is given by:

$$T_0 = 2 \cdot R \cdot C \cdot \ln\{(1+H/(2 \cdot S_{MAX}))/(1-H/(2 \cdot S_{MAX}))\} \quad \text{(eqn. 4)}$$

where R is the resistance of impedance 301, C is the value of capacitance 302 (and R·C is the time constant of the filter arrangement) and H is indicative of the amount of hysteresis.

It can be seen that, as discussed above with respect to equation 3, the cycle period T can increase significantly at higher input signal magnitudes. For instance at a signal magnitude of nine tenths of the maximum signal level, (|X|=0.9) the cycle period will be over five times longer than the limit cycle period $T_0$. The cycle frequency f will thus be over five times lower than the limit cycle frequency $f_0$.

This relatively large variation in cycle frequency or period of the output signal $S_{OUT}$ may be disadvantageous in some implementations. For instance any downstream time-decoding components may need to be able to cope with a large range of cycle period, which may add to the complexity of such decoding components. In addition, to ensure that cycle frequency remains sufficiently high at all signals levels may require the time constant of the filter arrangement 104 to be selected so that the limit cycle frequency is very high, which again may add to the complexity of downstream components. Otherwise as the cycle frequency reduces at higher signal magnitudes it could approach the signal band of interest.

Figure 4:
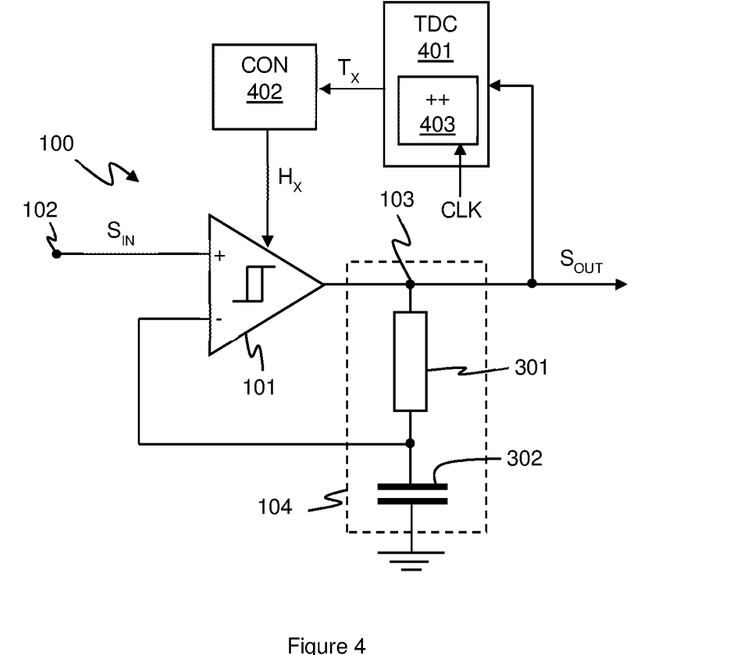
FIG. 4 illustrates an example of a modulator with adaptive hysteresis control.

To avoid these issues, FIG. 4 illustrates an embodiment of a time encoding modulator 100 with a controller 402 for controlling the cycle period of the time-encoding modulator. In the example illustrated in FIG. 4 the controller is operative to apply adaptive hysteresis control. The embodiment of FIG. 4 includes a Time-Decoding-Converter (TDC) 401 that receives the output signal $S_{OUT}$ and determines a time parameter $T_x$ of the time encoded signal $S_{OUT}$. The time parameter $T_x$ may be any parameter of the time encoded output signal $S_{OUT}$ that varies with signal magnitude in a known way. In this example the time parameter $T_x$ may be the present cycle period T, although equally the time parameter could be the duration of a pulse of one output state, $\alpha$ or $\beta$, or the duty cycle $\alpha/T$. This time parameter $T_x$ is provided to controller 402, which in this example is an adaptive hysteresis controller, that controllably varies the hysteresis $H_x$ applied by the hysteretic comparator 101. There are many ways the hysteresis applied by a hysteretic comparator 101 may be varied as will be understood by one skilled in the art.

As noted above in equation 4, the limit cycle period varies with the hysteresis H applied by the comparator 101. The controller 402 may thus controllably vary a value $H_x$ of the hysteresis applied so as to reduce the amount of hysteresis applied as the magnitude of the input signal increases, as indicated by the time parameter $T_x$, so as to maintain the cycle period, and hence the cycle frequency, within a defined range. Where the time parameter is the present cycle period the controller 402, i.e. the adaptive hysteresis controller, may reduce the amount of hysteresis as the time period T increases and vice versa in order to reduce the variation in the time period T by this feedback. In some instances the hysteresis may be generally controlled according to:

$$H_M = H_0 \cdot (1-X_e^2) \quad \text{(eqn. 5)}$$

where $H_0$ is the hysteresis applied at zero signal magnitude and $X_e$ is an estimate of the normalised signal X, derived from the time parameter which may for example be the duty cycle of the time encoded signal.

In some embodiments a TDC 401 may be provided in the signal path for the output signal $S_{OUT}$ for decoding the time encoded output signal into a different digital format, e.g. a multi-bit digital signal, in which case the TDC 401 may determine the duty cycle $\alpha/T$. However in some embodiments the TDC 401 may be provided just for hysteresis control. For hysteresis control a relatively accurate or precise indication of the level of the input signal may not be needed and it may be sufficient to determine the cycle period T relatively crudely. The TDC 401 may, in some embodiments comprise a counter 403 which is clocked by a reference clock signal CLK. The counter 403 may be configured to determine at least one count value of the number of reference clock cycles in a period corresponding to the relevant time parameter, for instance the counter 403 may count the number of reference clock cycles in each period between successive rising edges in the output signal $S_{OUT}$ and provide the cycle-by-cycle count value as the measure $T_x$ of the cycle period T. As mentioned for the hysteresis control a high level of accuracy may not be needed and thus the reference clock signal CLK need only be fast enough to provide the required time resolution of the period or pulse length of the time encoded signal.

Figure 5:
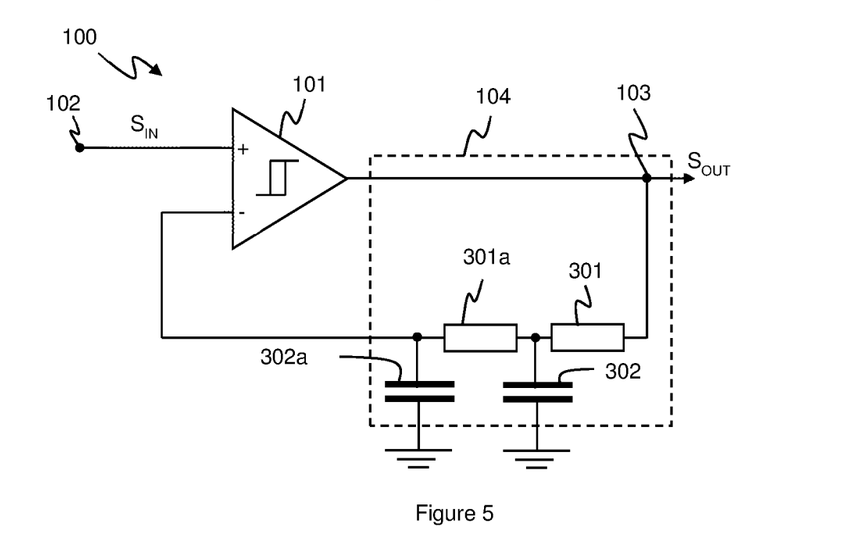
FIG. 5 illustrates an example of a modulator with a higher order filter.

Referring back to FIG. 3, as mentioned, the output signal $S_{OUT}$ is a square wave signal that is filtered by filter arrangement 104. In that example the filter 104 is a passive first order filter formed by impedance 301 and capacitance 302. It will be appreciated however that other filter arrangements may be implemented, for instance there may be higher order filters such as the cascaded second order filter arrangement illustrated in FIG. 5, which includes additional resistance 301a and additional capacitance 302a.

Figure 6A:
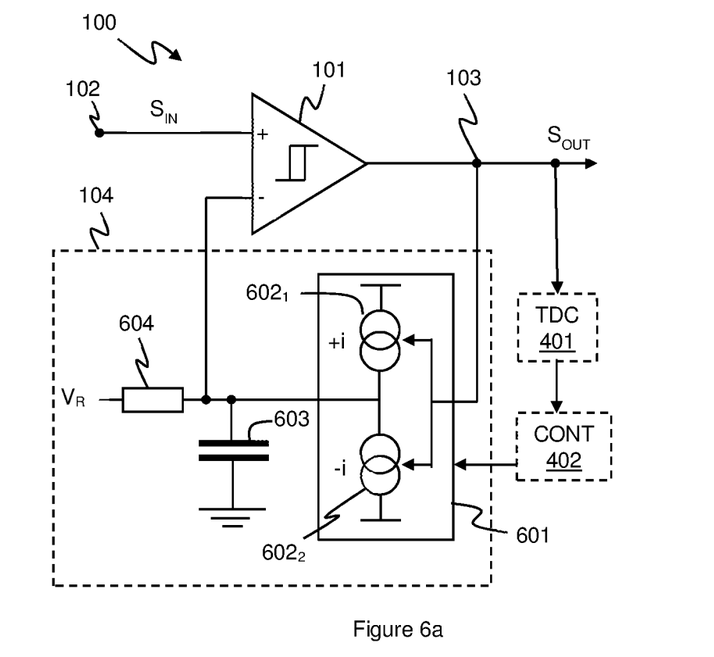
FIGS. 6a and 6b illustrate example of modulators with a current mode feedback path.

FIG. 6a illustrates an alternative arrangement in which the filter arrangement 104 comprises a current generator 601 configured to generate a current signal having a current that varies depending on the output state of the hysteretic comparator 101. In the example illustrated in FIG. 6a the current generator comprises a first current source 6011 for generating a defined positive current +i and second current source 6022 for generating a defined negative current −i, i.e. the second current source 6022 acts as a current sink. The first and second current sources 6021 and 6022 are controlled to generate a positive or a negative current depending on the output state of the comparator 101, that is the positive current +i is generated when the output signal $S_{OUT}$ is in one state and the negative current −i is generated when the output signal $S_{OUT}$ is the other state. The current signal output from the current generator 601 is supplied to a node coupled to a feedback capacitor 603, which is also biased to a reference voltage $V_R$ via impedance 604. The current signal thus charges or discharges the feedback capacitor 603 depending on its polarity. The rate of charging and discharging depends on the magnitude of the current produced by the current generator but also on the current through impedance 604, which in turn depends on the difference between the voltage of the feedback capacitor and the reference voltage $V_R$, which may conveniently correspond to the voltage of the zero magnitude input signal, e.g. the midpoint voltage. The voltage of the feedback capacitor thus provides the filtered feedback signal $S_{FB}$ for hysteretic comparator 101.

The use of a current generator 601 means that control of the cycle period can be achieved by controlling the magnitude of the defined currents +i/−i. Thus in some embodiments a TDC 401 and controller 402 may be arranged to monitor the output signal and control the modulator 100 to control the cycle period in a similar fashion as discussed above in relation to FIG. 4, but in this case the controller 402 may control the current generator 601, e.g. instance the current sources 6021 and 6022, to increase the magnitude of the current at higher signal magnitudes so as to increase the rate of change of the feedback signal $S_{FB}$.

One practical advantage of the use of a current generator is that avoids the need for voltage buffers to provide accurate voltage levels $V_H$ and $V_L$ in order for example to avoid the effects of power supply voltage variation. Such buffers need to be well designed in order to avoid transient effects as the feedback load is switched from $V_H$ to $V_L$ and vice versa to avoid, and thus may require more power and chip area than required for a simple current source whose output may be simply steered from the output node to some other node.

Figure 6B:
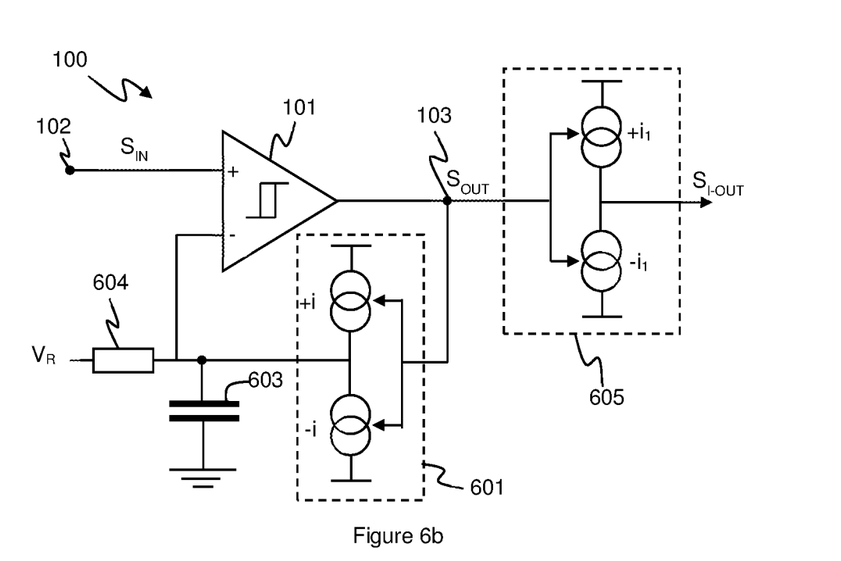

In some instances it may be desirable to output a time encoded output signal from the modulator, either instead of or in addition to a voltage modulated time encoded signal output from the hysteretic comparator 101. FIG. 6b illustrates an embodiment having a current generator 605 coupled to the output node. The current generator 605 may be operate in a similar manner as current generator 601 described with reference to FIG. 6a to provide currents $+i_1/-i_1$ which may or may not be the same as currents +i/−i generated by the current generator 601.

The modulator 100 according to the embodiments described above can thus be implemented as relatively small and simple circuitry which can be used as part of a converter with relatively good linearity without undue power demands. The modulator 100 may be used in a range of applications. For example the modulator 100 may be used as part of an analogue-to-digital converter (ADC) and may receive an analogue input signal.

Figure 7A:
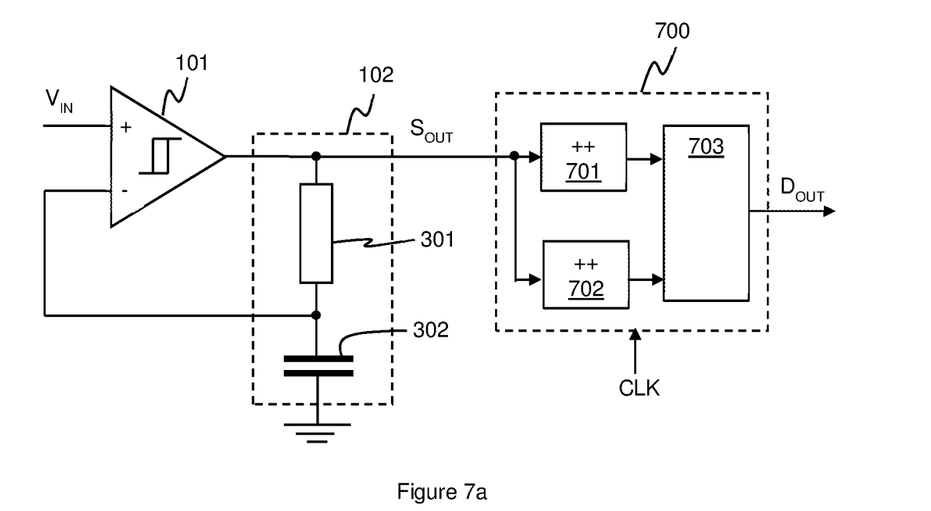
FIGS. 7a and 7b illustrate examples of analogue-to-digital converters having a modulator according to an embodiment.

As illustrated in FIG. 7a a time decoding converter (TDC) 700 may receive the output signal $S_{OUT}$ from the modulator 100 and convert this time-encoded output signal $S_{OUT}$ into a digital output signal $D_{OUT}$. There are a number of ways that a TDC 700 may decode a square wave PWM signal $S_{OUT}$ as would be understood by one skilled in the art. For instance first and second counters 701 and 702 could be clocked by a relatively fast clock signal CLK and configured to produce count values indicative of the duration α of the output state $V_H$ and duration β of the output state $V_L$ respectively. Calculation block 703 may receive the respective count values and determine an output value equivalent to α/α+β.

Figure 7B:
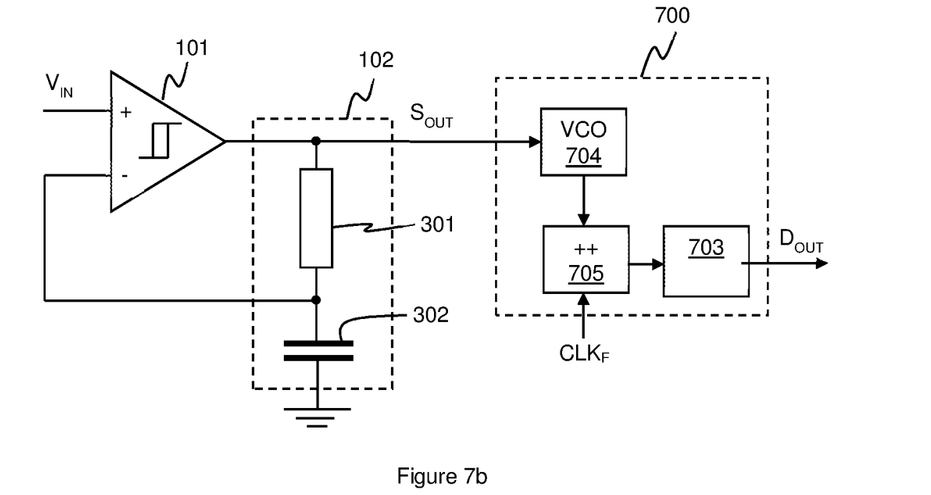

FIG. 7b illustrates another embodiment. In this example TDC 700 comprises a voltage controlled oscillator (VCO) 704 which outputs a first frequency $f_{high}$ or a second frequency $f_{low}$ according to the output state of the output signal $S_{OUT}$. A counter 705 receives the output from the VCO 704 and counts the number of oscillations in a series of count periods or frames defined by a clock signal $CLK_F$. The count values in each frame are passed to the calculation block 703. The count values over a number of frames can be averages and then decoded to provide a digital output $D_{OUT}$. The average count value corresponds to average frequency of the output of the VCO which itself corresponds to the duty cycle of the time encoded signal $S_{OUT}$. It should be noted that the frame period defined by the clock signal $CLK_F$ may not be matched to the cycle period of the time encoded signal as the cycle period may vary in use as discussed above. However the average count over a plurality of frames will be a count value that corresponds to the average frequency and hence the duty cycle.

Figure 8:
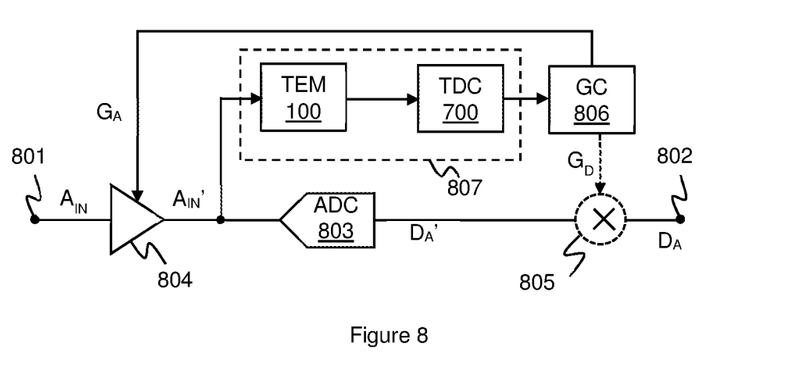
FIG. 8 illustrates an example of a modulator in a side channel being used for gain control of a main signal path.

As a modulator according to embodiments of the disclosure may be small, comprising a simple hysteretic comparator and, for example, a single non-critical RC network together with a small amount of digital circuitry, it may be implemented advantageously in a range of applications where some indication of analogue signal level is desired. FIG. 8 illustrates one embodiment where a time encoding modulator 100 is implemented as part of a gain control path for a main signal path. FIG. 8 illustrates a main signal path between a main path input 801 and a main path output 802. The main signal path may for instance be an audio signal path for receiving an input analogue audio signal $A_{IN}$ and outputting a digital audio signal DA. The main signal path thus comprises an ADC 803. ADC 803 may be any suitable type of ADC for the particular application and may for instance be a conventional switched capacitor type ADC or a VCO based ADC or the like. The ADC 803 may be designed to provide a desired level of precision and noise performance.

The main signal path may also have an analogue variable gain element 804 for applying a controlled analogue gain $G_A$ to the analogue signal $A_{IN}$ to provide a gained-up signal $A_{IN}'$ that is input to the ADC 803. The ADC 803 converts this signal to a corresponding digital signal DA'.

In some embodiments there may additionally be a digital gain element 805 for applying a controlled digital gain Go to the digital signal $D_{OUT}'$ that is output from the ADC 803. In such embodiments the analogue gain $G_A$ applied may be controlled, according to known dynamic range extension (DRE) techniques, based on an indication of the input signal level so as to maximise the use of an operating range of the ADC 803. That is, at lower signal levels the analogue gain $G_A$ applied may be increased to provide more amplification/less attenuation than for higher signal levels and vice versa. This maximises the use of input range of the ADC 803 and improves the signal-to-noise ratio (for quantisation noise) that otherwise would apply for lower signal levels. The digital gain $G_D$ may be controlled to substantially reverse at least part of the analogue gain $G_A$ applied and thus may be controlled at least partly inversely to the analogue gain $G_A$. A gain controller 806 thus controls the analogue and digital gains $G_A$ and Go accordingly.

For conventional DRE the analogue and digital gains $G_A$ and $G_D$ respectively may be controlled based on the gained-up input analogue audio signal $A_{IN}'$, for instance by comparing the gained-up input audio signal $A_{IN}'$ to one or more thresholds. However this may only allow relatively coarse control or require a relatively large amount of analogue circuitry. Alternatively the digital signal D'A output from the ADC 803 (or the gain adjusted digital audio signal DA) may be used as an indication of the signal level currently being converted by the ADC. However, as will be understood be one skilled in the art, it is important that for any relatively sudden rises in input signal level, the analogue gain $G_A$ is reduced in time before the signal level reaches a level that would cause clipping at the then-current gain level. This requires the gain controller 806 to react rapidly to increases in the analogue input signal level $A_{IN}$. For some ADCs there may be a processing latency associated with the conversion from an analogue signal to digital signal that means that the digital output signal DA' cannot be used for DRE control without setting limits as to when a higher analogue gain $G_A$ can be applied that are quite cautious, which may limit the performance gains realised.

In the embodiment of FIG. 8 the gained up analogue input signal $A_{IN}'$ is tapped from the main signal path and supplied to a time-encoding modulator 100 as a modulator input signal $S_{IN}$. The time encoding modulator outputs a time encoded signal as discussed above, which in this example is supplied to a TDC 700 such as discussed above in relation to FIG. 7a or 7b. The output from the TDC 700 is provided as a digital signal to the gain controller 806 which, as discussed may control the analogue and digital gains $G_A$ and $G_D$ accordingly for applying DRE.

Additionally or alternatively the gain controller 806 may be configured to apply automatic gain control (AGC) techniques. In such a case the indication of the level of the audio signal $A_{IN}$ provided by the TEM 100 and TDC 700 may be used to determine an optimum analogue gain setting $G_A$ for the input audio signal $A_{IN}$ present, so as to provide the maximum output level from the main signal path. In this case the gain controller 806 may apply some low-pass filtering or other time averaging or attack and decay time constants in order to determine an appropriate analogue gain setting $G_A$. For such applications a digital gain element 805 may not be present or, if present, may be controlled to a desired digital gain $G_D$ that does not vary with the AGC controlled analogue gain $G_A$.

Such arrangement may be of particular use in applications where occasional clipping of the input may be acceptable but where the SNR achieved is important, such as may be the case for an Always-On-Voice trigger application. Some audio algorithms for performing Always-On Voice detection may not work well with the frequent noise floor modulation that may result from using DRE techniques, whereas a training or start-up sequence to find the optimum gain (which then remains constant or varies only relatively slowly until other system events determine that the training should be rerun) may be acceptable.

In some embodiments the gain controller 806 may be operable in an AGC mode and also in a DRE mode with the appropriate operation being controlled based on the present use case.

The time-encoding modulator 100 together with the TDC 700 thus effectively provide another ADC 807 in a side-path to the main signal path. This additional ADC 807 is provided for gain control. Conventionally one would not seek to implement an additional ADC for controlling gain applied to another ADC. However the time encoding modulator 100 according to embodiments of the invention can be implemented by small and low power circuitry, as can the TDC 700 and thus such an embodiment provides a very small and power efficient ADC 807 for a side channel that has sufficient performance and low latency, for instance to allow control of DRE for ADC 803 in the main signal path. The ADC 803 of the main signal path may be a relatively large circuit and/or may have higher power consumption. The side path ADC 807 may allow for better gain control thus maximising the performance of the main path ADC 803.

It should be noted that the analogue gain element 804 and digital gain element 805 are illustrated as separate components to the main path ADC 803 for ease of explanation. These elements may be separate to the ADC 803 but in some implementations the controlled digital or analogue gain elements 804 and 805 respectively may be combined with the input or output stages, respectively, of the ADC 803.

Embodiments thus provide a time-encoding modulator that encode an input signal to the modulator, which is an analogue input signal $S_{IN}$ with some varying signal information component, into a time-encoded, pulse width modulated (PWM) signal. The input signal $S_{IN}$ is compared to a feedback signal $S_{FB}$ derived from the output signal $S_{OUT}$ and which is a filtered version of the output signal. The maximum magnitude of the input signal $S_{IN}$ should thus be no greater than the maximum value of the feedback signal $S_{FB}$, which is defined by the output signal levels $S_{OUT}$ and the feedback arrangement. In some embodiments it may be desirable to apply some level shifting or scaling of the input signal $S_{IN}$ and/or the feedback signal $S_{FB}$.

Figure 9:
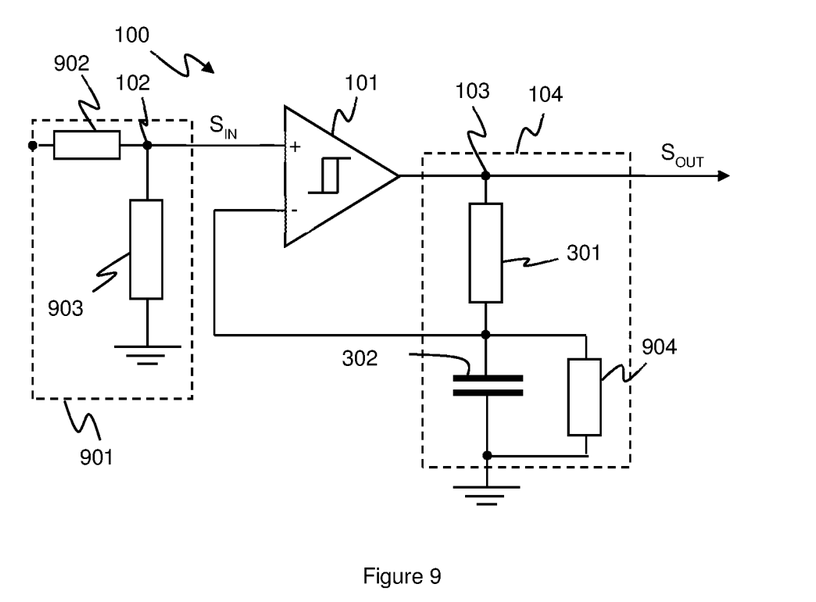
FIG. 9 illustrates an example of controlling the gain of a modulator.

FIG. 9 illustrates an embodiment with scaling or gain applied to the input signal $S_{IN}$ and the feedback signal $S_{FB}$.

In this embodiment a level shifter 901 is coupled to the input node 102 so as to apply scaling of the input signal $S_{IN}$. In this embodiment the level shifter is a potential divider formed by resistances 902 and 903. As will be understood this scales the input signal by a factor of $R_{903}/(R_{902}+R_{903})$ where $R_n$ is the resistance value of the relevant resistor. Additionally or alternatively scaling may be applied to the feedback signal $S_{FB}$, so as to effectively apply gain to the output signal $S_{OUT}$. Additional resistor 904 may be included in the filter arrangement 104 to apply a gain factor equal to $(1+R_{301}/R_{904})$.

The modulator 100 may have relatively high impedance. This has the advantage that an AC coupling capacitance may be realised as part of the same integrated circuit, i.e. on the same chip, as the modulator 100, rather than requiring an off-chip capacitance as would normally practically be required for other forms of modulator.

Figure 10:
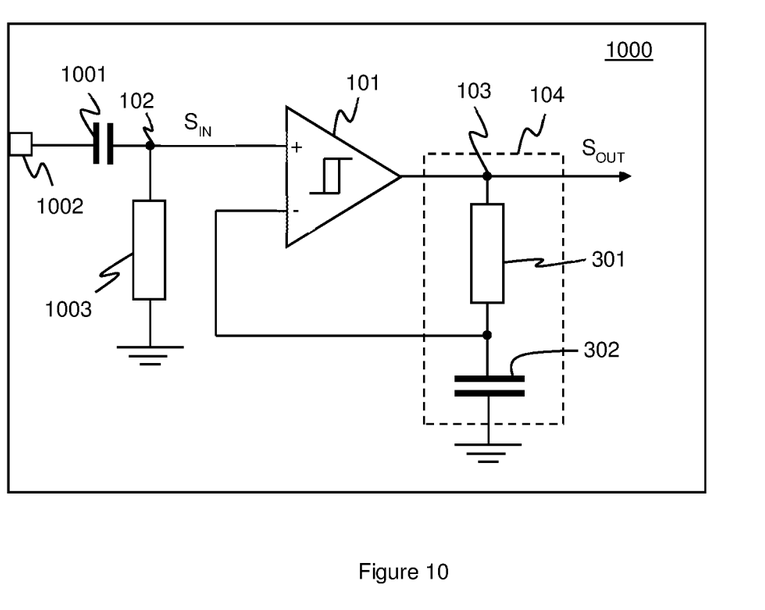
FIG. 10 illustrates a modulator with an AC on-chip coupling capacitor.

FIG. 10 illustrates an integrated circuit 1000 comprising a time encoding modulator 100 according to an embodiment. Integrated circuit 1000 includes an AC coupling capacitance 1001 formed as part of the integrated circuit, e.g. in a signal path between an input pin 1002 and the hysteretic comparator 101. Because of the high input impedance of the modulator the capacitance 1001 may be relative small, e.g. of the order of a few pf or so, and thus may practically be implemented on chip. A high impedance element 1003 may be coupled between the input signal path and ground and implemented by on-chip poly-diodes or the like.

The skilled person will thus recognise that some aspects of the above described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments of the present invention will be implemented on a DSP (Digital Signal Processor), ASIC (Application Specific Integrated Circuit) or FPGA (Field Programmable Gate Array). Thus the code may comprise conventional program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communications with one another. Where appropriate, the embodiments may also be implemented using code running on a field-(re)programmable analogue array or similar device in order to configure analogue hardware.

Some embodiments of the present invention may be arranged as part of an audio processing circuit, for instance an audio circuit which may be provided in a host device. A circuit according to an embodiment of the present invention may be implemented as an integrated circuit. One or more microphones may be connected to the integrated circuit in use.

Embodiments of the present invention may be implemented in a host device, especially a portable and/or battery powered host device such as a mobile telephone, an audio player, a video player, a PDA, a mobile computing platform such as a laptop computer or tablet and/or a games device, for example.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

The invention claimed is:

1. A time-encoding modulator comprising:
    an input node for receiving an analogue input signal;
    an output node for outputting a time-encoded signal;
    a hysteretic comparator comprising a first comparator input connected to the input node and a comparator output connected to the output node;
    a feedback path between the output node and a second comparator input of the hysteretic comparator;
    a filter arrangement for applying filtering to the feedback path; and
    a modulator controller for controlling the modulator so as to control a cycle period of the time-encoded signal, wherein the modulator controller is configured to control the modulator based on the time-encoded signal.

2. A time-encoding modulator as claimed in claim 1 further comprising a time-to-digital-converter configured to receive the time-encoded signal and output a digital control signal based on a parameter of the time-encoded signal, wherein the modulator controller is configured to receive the digital control signal.

3. A time-encoding modulator as claimed in claim 2 wherein said parameter comprises one of: a duration of a cycle period of the time-encoded signal; a duty-cycle of the time-encoded signal, and a duration of a pulse of the time encoded signal.

4. A time-encoding modulator as claimed in claim 3 wherein the time-to-digital converter is configured to receive a reference clock signal and comprises a counter configured to produce at least one count value of the number of clock cycles of the reference clock signal in a period defined by the parameter of the time-encoded signal.

5. A time-encoding modulator as claimed in claim 1 wherein said modulator controller comprises a hysteresis controller for controlling hysteresis of the hysteretic comparator.

6. A time-encoding modulator as claimed in claim 1 wherein the filter arrangement comprises a resistive-capacitive filter.

7. A time-encoding modulator as claimed in claim 1 wherein the hysteretic comparator is configured to generate at the comparator output either a first voltage state or a second voltage state and to transition between said first and second voltage states based on a hysteretic comparison of signal levels at the first and comparator inputs.

8. A time-encoding modulator as claimed in claim 7 wherein the filter arrangement comprises:
    a first current generator configured to receive the time-encoded signal and to generate a first controlled current signal having a first defined current during periods of the first voltage state and a second defined current during periods of the second voltage state; and
    a capacitor coupled to the feedback node and configured to be charged and discharged by the first controlled current signal.

9. A time encoding modulator as claimed in claim 8 where said modulator controller is configured to control the first current generator so as to control the magnitude of the first defined current and the second defined current.

10. A time encoding modulator as claimed in claim 8 comprising a second current generator configured to generate a second controlled current signal based on the time-encoded signal, wherein the apparatus is configured to output the second controlled current signal as a modulator output signal.

11. A time encoding modulator as claimed in claim 1 wherein the filter arrangement is configured to apply a controlled gain to the feedback signal.

12. A time encoding modulator as claimed in claim 1 comprising a level shifter coupled to the input node for applying a defined level shift to the input signal.

13. An analogue-to-digital converter (ADC) comprising a time encoding modulator as claimed in claim 1 further comprising a time-decoding-converter configured to convert the time-encoded signal to a corresponding ADC output digital signal.

14. An ADC as claimed in claim 13 wherein the time-decoding-converter comprises a voltage controlled oscillator (VCO) configured to receive the time-encoded signal and a counter configured to receive the output of the VCO and count a number of oscillations in each of a plurality of frames defined by a frame clock signal.

15. A signal processing circuit comprising:
a main signal path for receiving a first analogue signal and outputting a first digital signal;
a first analogue-to-digital converter (ADC) in the main signal path;
a variable analogue gain element for applying a controlled analogue gain to the main signal path upstream of the first ADC; and
a gain controller for controlling the variable analogue gain element; and
a second ADC configured to receive a version of the first analogue signal from the main signal path wherein the second ADC is an ADC as claimed in claim 12;
wherein the gain controller is configured to control the variable analogue gain element based on the digital signal generated by said time encoding modulator.

16. A signal processing circuit as claimed in claim 15 wherein the gain controller is operable in an automatic gain control mode to determine an analogue gain that provides an optimised signal-to-noise ratio.

17. A signal processing circuit as claimed in claim 15 further comprising a variable digital gain element for applying a controlled digital gain to the main signal path downstream of the first ADC wherein the gain controller is operable in dynamic range extension mode wherein the gain controller is configured to control the variable analogue gain element and the variable digital gain element at least partly inversely based on the digital signal generated by said time encoding modulator.

18. An electronic device comprising a time encoding modulator as claimed in claim 1 wherein the device is at least one of: a battery powered device; a portable device; a communications device; a mobile telephone; a smartphone; a computing device; a laptop; notebook or tablet computer; a gaming device; a personal media player; a wearable device; a voice controlled device.

19. A time encoding modulator comprising:
a hysteretic comparator comprising:
a first comparator input coupled to an input node to receive an input signal with a signal component that may vary over time; and
a second comparator input coupled to a feedback node to receive a feedback signal;
the hysteretic comparator being configured to compare, with hysteresis, the input signal to the feedback signal and to transition between first and second output states based on said comparison so as to generate a time-encoded output signal at a comparator output; and
a filter arrangement configured to filter the time-encoded signal to provide the feedback signal to the feedback node.

20. A time encoding modulator comprising:
a comparator comprising:
a first input for receiving an input signal; and
a second input for receiving a feedback signal;
wherein the comparator is configured to compare, with hysteresis, the input signal to the feedback signal so as to generate a time-encoded output signal at a comparator output; and
a filter arrangement configured to filter the time-encoded signal so as to provide the feedback signal to the second input.

* * * * *

UNITED STATES PATENT AND TRADEMARK OFFICE
CERTIFICATE OF CORRECTION

PATENT NO. : 10,263,633 B2  
APPLICATION NO. : 15/991619  
DATED : April 16, 2019  
INVENTOR(S) : John Paul Lesso and David Paul Singleton Page 1 of 3

It is certified that error appears in the above-identified patent and that said Letters Patent is hereby corrected as shown below:

On the Title Page

Item [56], Column 1, Line 4, delete "Anaysis" and insert -- Analysis --, therefor.

In the Specification

In Column 2, Lines 44-45, delete "may configured" and insert -- may be configured --, therefor.

In Column 4, Line 64, delete "can useful" and insert -- can be useful --, therefor.

In Column 7, Line 7, delete "by a and" and insert -- by α and --, therefor.

In Column 7, Line 47, delete "an example of an example of" and insert -- an example of --, therefor.

In Column 9, Line 34, delete "6011" and insert -- $601_1$ --, therefor.

In Column 9, Line 36, delete "6022" and insert -- $602_2$ --, therefor.

In Column 9, Line 37, delete "6022" and insert -- $602_2$ --, therefor.

In Column 9, Line 38, delete "6021 and 6022" and insert -- $602_1$ and $602_2$ --, therefor.

In Column 9, Line 65, delete "6021 and 6022," and insert -- $602_1$ and $602_2$, --, therefor.

In Column 10, Lines 15-16, delete "may be operate" and insert -- may operate --, therefor.

In Column 11, Line 17, delete "DA'." and insert -- $D_A'$. --, therefor.

In Column 11, Line 19, delete "gain Go" and insert -- gain $G_D$ --, therefor.

Signed and Sealed this  
Fifth Day of November, 2019

Andrei Iancu  
*Director of the United States Patent and Trademark Office*

CERTIFICATE OF CORRECTION (continued)
U.S. Pat. No. 10,263,633 B2

In Column 11, Line 35, delete "Go" and insert -- $G_D$ --, therefor.

In Column 11, Line 43, delete "DA)" and insert -- $D_A$) --, therefor.

In the Claims

Column 14, Line 66, Claim 9, should read:
9. A time-encoding modulator as claimed in claim 8 where said modulator controller is configured to control the first current generator so as to control the magnitude of the first defined current and the second defined current.

Column 15, Line 3, Claim 10, should read:
10. A time-encoding modulator as claimed in claim 8 comprising a second current generator configured to generate a second controlled current signal based on the time-encoded signal, wherein the apparatus is configured to output the second controlled current signal as a modulator output signal.

Column 15, Line 9, Claim 11, should read:
11. A time-encoding modulator as claimed in claim 1 wherein the filter arrangement is configured to apply a controlled gain to the feedback signal.

Column 15, Line 12, Claim 12, should read:
12. A time-encoding as claimed in claim 1 comprising a level shifter coupled to the input node for applying a defined level shift to the input signal.

Column 15, Line 15, Claim 13, should read:
13. An analogue-to-digital converter (ADC) comprising a time-encoding modulator as claimed in claim 1 further comprising a time-decoding-converter configured to convert the time-encoded signal to a corresponding ADC output digital signal.

Column 15, Line 26, Claim 15, should read:
15. A signal processing circuit comprising:
    a main signal path for receiving a first analogue signal and outputting a first digital signal;
    a first analogue-to-digital converter (ADC) in the main signal path;
    a variable analogue gain element for applying a controlled analogue gain to the main signal
        path upstream of the first ADC; and
    a gain controller for controlling the variable analogue gain element; and
    a second ADC configured to receive a version of the first analogue signal from the main
        signal path wherein the second ADC is an ADC as claimed in claim 13;
    wherein the gain controller is configured to control the variable analogue gain element based
        on the digital signal generated by said time-encoding modulator.

Column 16, Line 11, Claim 18, should read:
18. An electronic device comprising a time-encoding modulator as claimed in claim 1 wherein the
    device is at least one of: a battery powered device; a portable device; a communications
    device; a mobile telephone; a smartphone; a computing device; a laptop; notebook or tablet computer; a gaming device; a personal media player; a wearable device; a voice controlled device.